United States Patent [19]

Lin

[11] Patent Number: 5,348,775
[45] Date of Patent: Sep. 20, 1994

[54] PRODUCTION OF PT/PZT/PLZT LASER 'DIRECT WRITE' PATTERNS

[75] Inventor: Chhiu-Tsu Lin, DeKalb, Ill.

[73] Assignee: Northern Illinois University, DeKalb, Ill.

[21] Appl. No.: 14,778

[22] Filed: Feb. 8, 1993

Related U.S. Application Data

[62] Division of Ser. No. 707,800, May 30, 1991, Pat. No. 5,188,902.

[51] Int. Cl.$^5$ ............................................. B05D 3/06
[52] U.S. Cl. .................................. 427/555; 427/556; 427/596
[58] Field of Search ................ 427/556, 554, 596, 555

Primary Examiner—Bernard Pianalto
Attorney, Agent, or Firm—Allegretti & Witcoff, Ltd.

[57] ABSTRACT

This invention encompasses methods and reagents for making PT, PZT, and PLZT as well as their extrinsic ions doped powders and thin films. In particular, the invention includes methods for localized laser annealing of PT, PZT, PLZT films to the surface of materials to provide articles useful in electronic devices such as high value capacitors, optical switches, wave guides, and the like. A 15–25% by weight of PT/PZT/PLZT in about a 5–10% acetic acid solution having an effective wetting agent of a surfactant has been found to be a superior isolation for making both powders and thin films, especially thin films for laser writing.

5 Claims, 6 Drawing Sheets

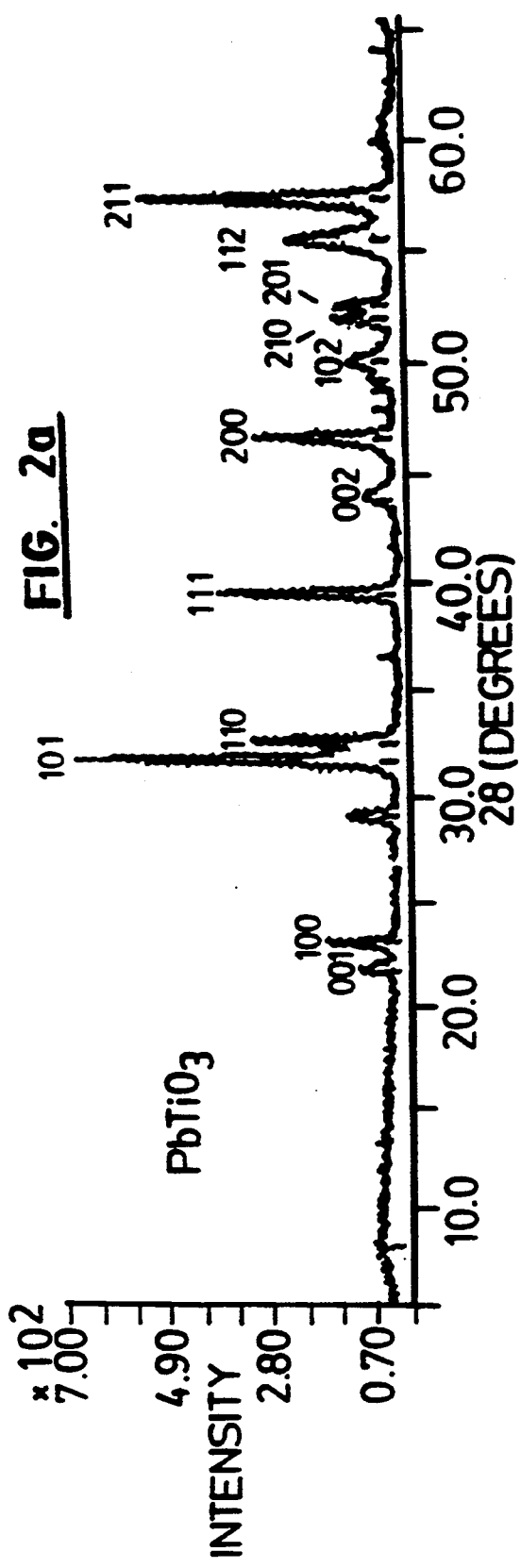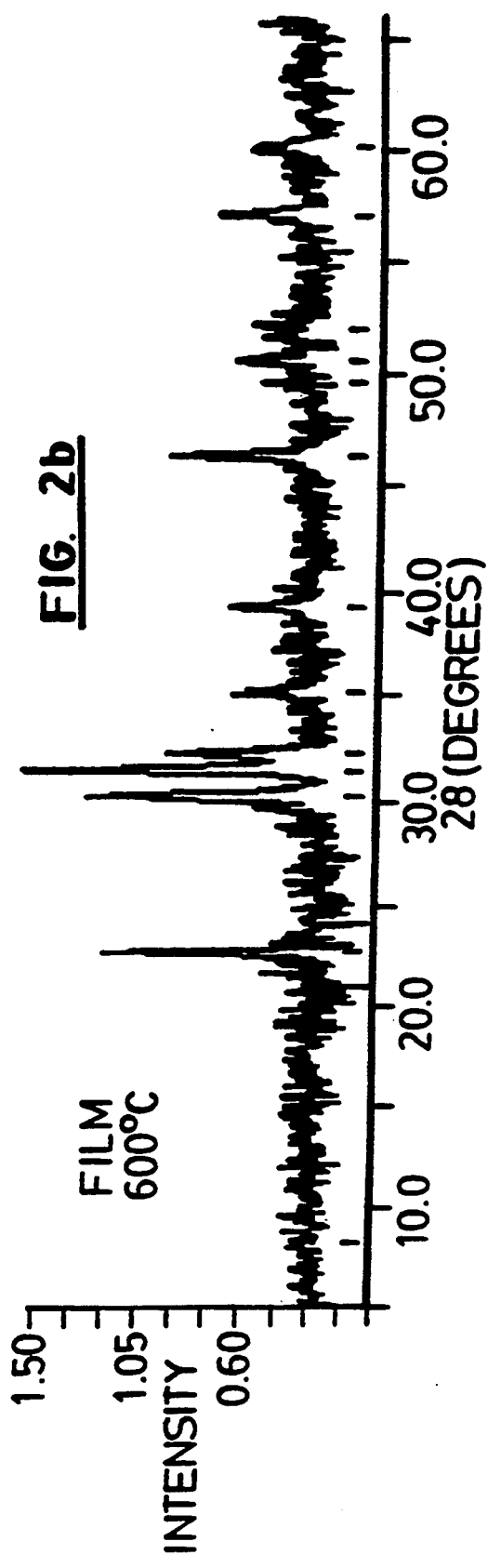

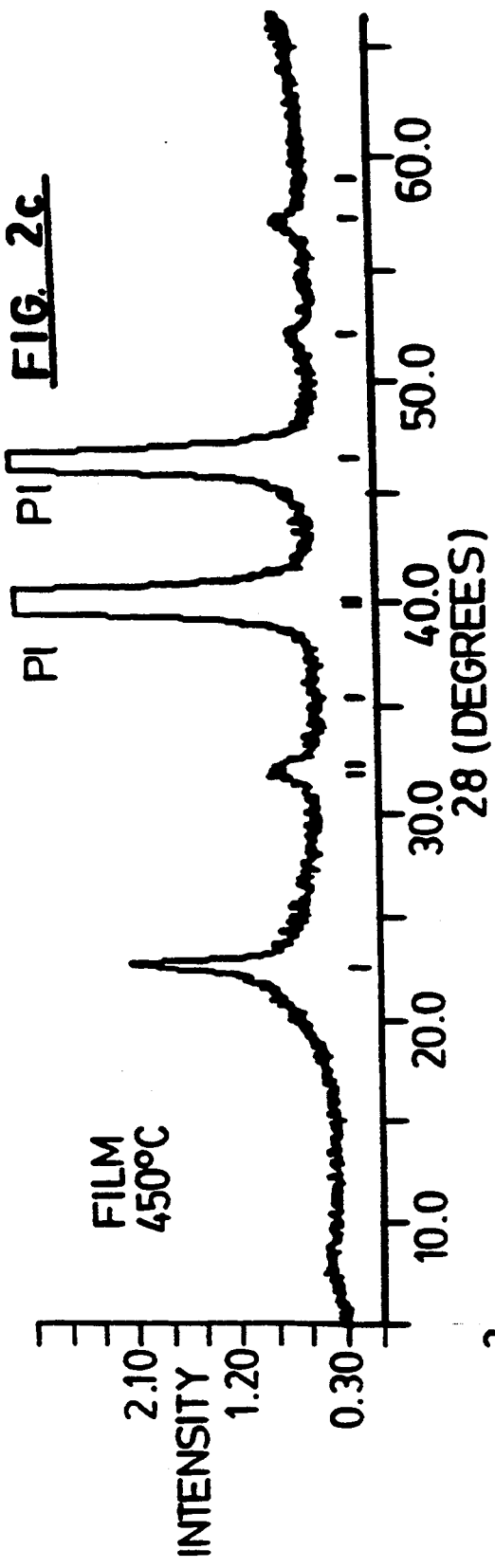
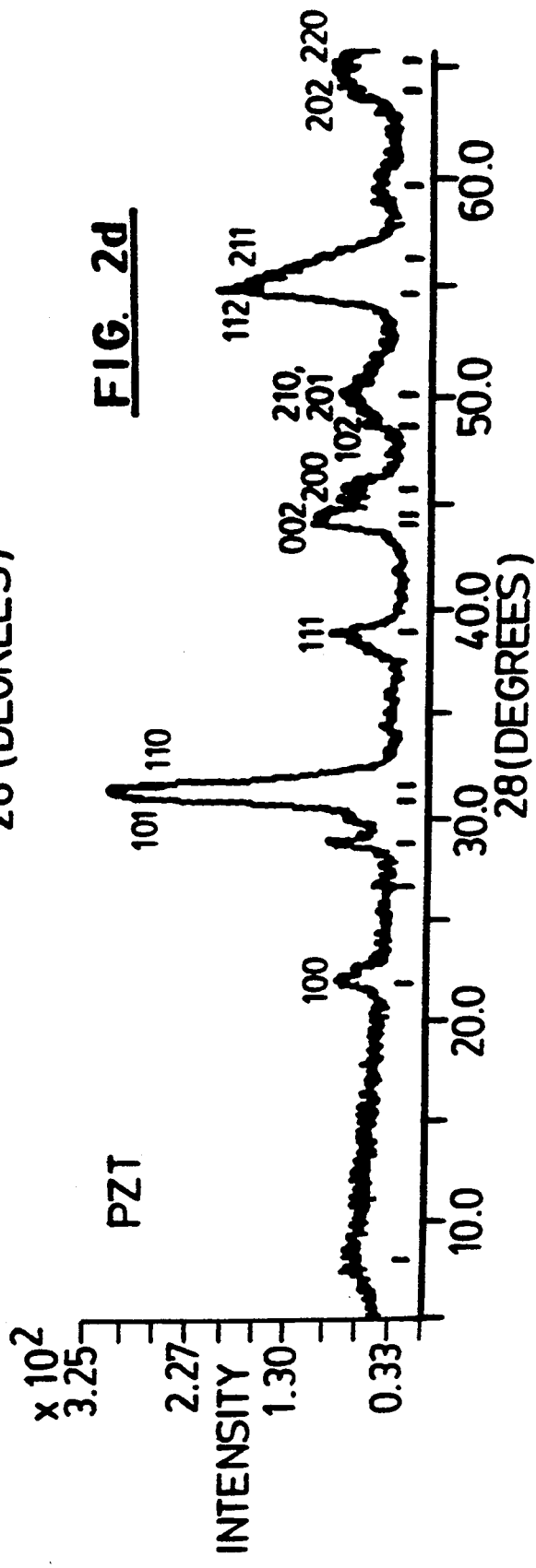

PRODUCTION OF PT/PZT/PLZT LASER 'DIRECT WRITE' PATTERNS

This is a divisional of application Ser. No. 07/707,800, filed on May 30, 1991, U.S. Pat. No. 5,188,902.

BACKGROUND OF THE INVENTION

1. Field of the Invention

This invention is in the field of making thin ferroelectric films comprising PT, PZT, or PLZT with temperature of crystallization of 450°, 500° or 500° C., respectively. The invention also relates to acetate-based aqueous solutions, methods for making ferroelectric films and devices utilizing such films.

2. Description of the Prior Art

There has been considerable interest in the production of ferroelectric lead perovskites such as $PbTiO_3$ (PT), $Pb_x(Zr_y,Ti_{1-y})O_3$ (PZT) and $(Pb_{1-x},La_x)(Zr_y,Ti_{1-y})_{1-x/4}O_3$ (PLZT) owing to their unusual dielectric, pyroelectric, piezoelectric and nonlinear optical properties: (C. E. Land, P. D. Thatcher, and G. H. Haertling, "Electrooptic Ceramics," in *Appl. Solid State Sci.*, Vol. 4, R. Wolfe, Ed., Academic, New York, 1974, P.137-233). Applications include high value capacitors (Y. Shintani and O. Tada, "Preparation of Thin Barium Titanate Films" by D.C. Diode Sputtering, *J. Appl. Phys.*, 41, 2376-80 (1970)), optical switches (K. Wasa, O. Yamazaki, H. Adachi, T. Kawaguchi, and K. Setsune, "Optical TIR Switches Using PLZT Thin-Film Waveguides on Sapphire," *IEEE J. Light Wave Tech. L.T.*, 2, 710-14 (1984)), displays and memories (Y. Hamakawa, Y. Matsui, Y. Higuma, and T. Nakagawa, "A Nonvolatile Memory FET Using PLT Thin Film Gate" in *Technical Digest IEEE International Electron Devices Meeting* (Electron Devices Society, The Institute of Electrical and Electronics Engineers, Washington, D.C., 1977), p.294-7).

Recent research on PT/PZT/PLZT perovskites has extended from bulk materials to thin films (H. Adachi, T. Kawaguchi, K. Stesune, K. Ohji, and K. Wasa, "Electro-Optic Effects of (Pb,La)(Zr, Ti)$O_3$ Thin Films Prepared by rf Planar Magnetron sputtering," *Appl. Phys. Lett.*, 42, 867-88 (1983)), (K. D. Budd, S. K. Dey and D. A. Payne, "Sol-gel Processing of Lead Titanate (PbTiO$_3$), Lead Zirconate (PbZrO$_3$), PZT, and PLZT Thin Films," *Proc. British Ceram. Soc.*, 36, 107-21 (1985)), (R. W. Vest and J. Xu, "Preparation and Properties of PLZT Films from Metallo-Organic Precursors, "*Ferroelectrics*, 93,21-29 (1989), (G. H. Haertling, "An Acetate Process for bulk and Thin Film PLZT," *the Seventh International Symposium on the Applications of Ferroelectrics,"* University of Illinois at Urbana-Champaign, Jun. 6-8, 1990). These thin films have been successfully synthesized from metal alkoxides via sol-gel (K. D. Budd, S. K. Dey and D. A. Payne, "Sol-gel Processing of Lead Titanate (PbTiO$_3$), Lead Zirconate (PbZrO$_3$), PZT, and PLZT Thin Films," *Proc. British Ceram. Soc.*, 36, 107-21, (1985)), fatty-acid salts of metals via metallo-organic decomposition (MOD), (R. W. Vest and J. Xu, "Preparation and Properties of PLZT Films from Metallo-Organic Precursors," *Ferroelectrics*, 93,21-29 (1989), and metal acetate precursors via aqueous solution techniques, (G. H. Haertling, "An Acetate Process for bulk and Thin Film PLZT," *the Seventh International Symposium on the Applications of Ferroelectrics,"* University of Illinois at Urbana-Champaign, Jun. 6-8, 1990). These processes have the advantage over other techniques of greater purity and compositional control with better homogeneity of mixing and lower processing temperatures. In the metal acetate precursors via aqueous solution technique, titanium acetylacetonate or titanium oxide-acetyl acetonate have been precursors for synthesizing PLZT thin films which crystallize at 700° C. This temperature is far from the ideal one (~500° C.) suitable for the device fabrication integrated with semiconductor processing. Other unsolved problems of these chemical processes are (1) the long-term stability of the formulated precursor solutions, (2) the substrate wetting (i.e., a poor film-substrate adhesion), and (3) film cracking (often due to a low metals/organics ratio leading to extensive film shrinkage on pyrolysis of the organics). U.S. Pat. No. 4,990,324 (Okira) describes a method for making 2 or 3 component lead zirconate-titanate systems. U.S. Pat. No. 4,963,390 describes method for depositing lead titanate (PT), lead zirconate titanate (PZT) and PZT doped films such as with lanthanum (PLZT). U.S. Pat. No. 4,832,893 describes a methods for making PLZT. U.S. Pat. No. 4,810,484 describes method for manufacturing fine lead titanate powders.

BRIEF DESCRIPTION OF THE INVENTION

The invention encompasses solutions, powders, and thin films of PT, PZT or PLZT and methods of annealing thin films to solid surfaces (substrates for electronic devices). For device application, the most commonly used substrate is a 3 inch diameter <100> silicon wafer surface where 1000 Å films of titanium and platinum were evaporated at room temperature to serve as a bottom electrode for the PT/PZT/PLZT thin film depositions. The invention, particularly, includes localized annealing of these films to the surface of a solid material by the use of a laser beam, i.e. writing various designs with a laser and washing off the material not exposed to the laser beam to provide a desired which is sometimes referred to as "laser direct writing." The invention includes articles of manufacture having PT, PZT, or PLZT annealed to a portion of the surface by irradiation with a laser. The invention includes films thermally annealed and powders.

A novel, stable, acetate-based process for the production of PT/PZT/PLZT thin films and powders has been developed. The aqueous acetate process is a non-moisture-sensitive alternative to sol-gel techniques. The acetate technique also offers advantages over the previously developed metallo-organic decomposition technique involving long-chain carboxylic acid salts, since the acetate process offers greater control over surfactant concentration and a better metals/organics ratio in the dried film. Moreover, the acetate process uses an aqueous solution; the acetate, acetylacetonate, or carbonate salts of various metal ions can be easily added to the solution to prepare doped PT/PZT/PLZT perovskites. The crystallization temperature is lower when titanium acetate is employed. This is consistent with other work that titanium acetate gels form polynuclear complexes with other metal ions in solution (A Mosset, I. Gautier-Luneau and J. Galy, "Sol-gel Processed BaTiO$_3$: Structural Evolution from the Gel to the Crystalline Powder," *J. Non-Cryst. Solids*, 100, 339-44(1988)). In accordance with the invention crystalline PT, PZT and PLZT are formed at low annealing temperatures of 450°, 500° and 500° C., indicative of intermolecular mixing.

The use of a surfactant enhances film-substrate binding in the metallo-organic film (C. T. Lin, H. Y. Lee and M. A. Souto, "Effect of surfactant on casting metalorganic films and writing copper metal patterns", J. Mater. Res., 6, 760 (1991)) and produces quality annealed PT/PZT/PLZT films on fused quartz, silicon and platinum coated quartz and similar substrates. The invention describes the first reported laser writing of PT, PZT and PLZT perovskites from metallo-organic thin films and articles made therefrom.

The present invention offers advantages in processing techniques for ferroelectric thin films and material as follows: (a) the formulated precursor solutions are stable with no gelation or precipitation for several months; (b) the aqueous acetate process is a non-moisture-sensitive alternative to sol-gel techniques; (c) crystalline perovskites are formed at a relatively low temperature and free of organic impurities. Results indicate that PT, PZT, and PLZT crystallize at 450° C., 500° C. and 500° C., respectively. These temperatures are preferable for device fabrication; (d) the acetate/micellar process offers greater control over surfactant concentration and a better metals/organics ratio in the dried film; and (e) the acetate process uses an aqueous solution; the acetate, acetylacetonate, or carbonate salts of various metal ions can easily be added to the solution to prepare doped PT/PZT/PLZT perovskites. A photosensitive layer of singly or doubly doped, chromium, iron, neodrymium, europium, praseodymium, molydbenum, ytterbium, terbium, manganese, tungston and vanadium, PT/PZT/PLZT thin films can be fabricated for device application, e.g. a high-speed optical Total Internal-Reflection switch. The device will allow an ultra fast switching operation using a visible light laser. Moreover, the use of a surfactant, such as Triton X-100, enhances film-substrate binding of metalorganic films which result in high quality annealed PT/PZT/PLZT films on solid surfaces such as fused quartz, silicon and platinum-coated quartz substrates.

BRIEF DESCRIPTION OF THE DRAWINGS

FIG. 2: X-ray diffusion spectra: (a) PT powder, (b) PT film on quartz annealed at 600° C., (c) PT film on platinum consolidated at 450° C., and (d) PZT powder.

DETAILED DESCRIPTION OF THE INVENTION

This invention provides for localized annealing of PT/PZT/PLZT film to solid surfaces such as silicon, platinum coated, sapphire, quartz or silica and the like to provide well-defined patterns of ferroelectric films. Ferroelectric substances are of practical use in many fields because of the pyroelectric, piezoelectric, and non-linear optical properties of such materials.

The ferroelectric thin films of this invention are useful in devices such as high value capacitors, optical switches, displays and memories. Those skilled in this art will recognize a wide variety of uses of the ferroelectric thin films and powders of this invention.

Thus, the invention includes articles of manufacture comprising a solid surface having a thin ferroelectric film on a portion of the surface wherein the ferroelectric film is formed by annealing PT, PZT, or PLZT to the solid surface with a laser. Solid surfaces include glass, quartz, gold, silver, platinum, sapphire, or ceramic material. Those skilled in the arts will recognize a wide variety of such materials.

The invention includes solutions for making a thin ferroelectric film comprising about 15 to 25% by weight of PT, PZT, or PLZT in about 5–10% aqueous acetic acid solution wherein the titanium is in the acetate form. The solution further contains an effective wetting amount of a surfactant, preferably a nonionic surfactant.

The invention further includes a method for forming a design of a thin ferroelectric film on a solid surface comprising:

(a) providing a solution of about 15 to 25 percent by weight of PT, PZT, or PLZT in about 5–10% aqueous acetic acid solution having an effective wetting amount of a surfactant, wherein the titanium is in the form of titanium acetate;

(b) spin-coating the solid surface with the solution of (a);

(c) drying the coating;

(d) irradiating the dried spin-coated solid surface with a laser in the desired pattern to anneal the PT, PZT or PLZT to the solid surface; and (e) washing the surface with a strong acid to remove PT, PZT, or PLZT not annealed by irradiation with the laser thereby leaving a pattern of the laser annealed PT, PZT, or PLZT on the solid surface.

Solid surfaces include glass, quartz, platinum, gold, silver, sapphire, silicon, or ceramic material.

Figure 4:
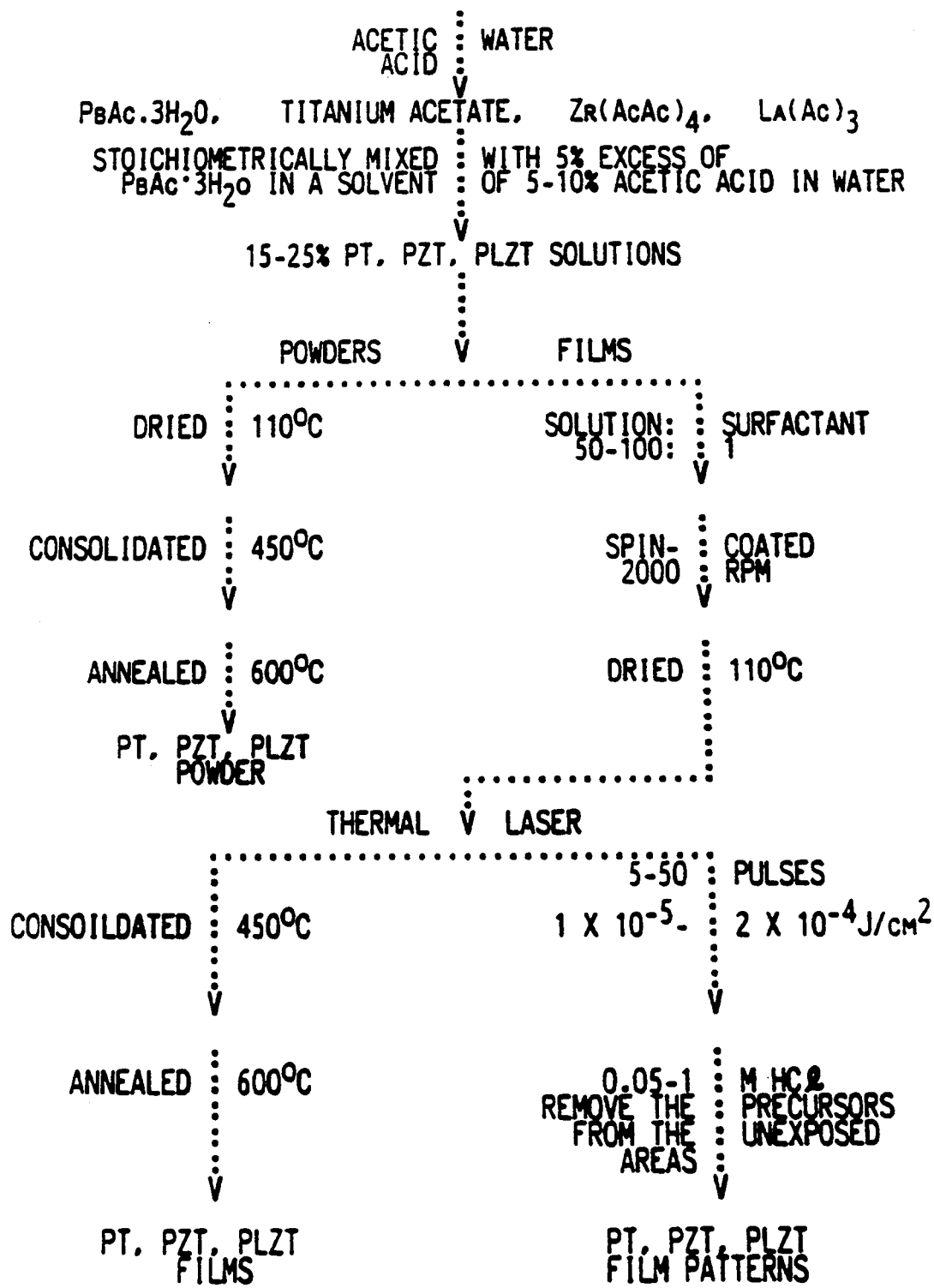
FIG. 4: Scheme for Preparation of Thin Films.

FIG. 4 illustrates the overall scheme for preparing thin films and powders of the present invention.

Titanium acetate was synthesized from titanium (IV) isopropoxide, acetic acid, and water using a modified known method (A. Mosset, I. Gautier-Luneau and J. Galy, "Sol-gel Processed $BaTiO_3$: Structural Evolution from the Gel to the Crystalline Powder," J. Non-Cryst. Solids. 100, 339–44 (1988)), forming a clear solution which is stable for a week or more. The other metallo-organic precursors were lead acetate trihydrate, lanthanum acetate, zirconium acetate and zirconium acetylacetonate powder. The precursors were formulated to make stoichiometric PT, PZT or PLZT with 5% excess lead precursor. A solvent of 5–10% acetic acid in water was used to make solutions containing 15–25% metallo-organics. The prepared solutions have been observed to be stable with no gelation or precipitation for several months.

Powders of ferroelectric perovskites were prepared for analysis via X-ray diffraction and Fourier transform infrared spectroscopy (Mattson CYGNUS 25 FTIR) using a KBr pellet. The formulated solutions were first dried at 110° C. They were observed to undergo gelation after some initial loss of solvent, and dried to a hardened, glassy gel. Then, the organics were pyrolyzed at 400°–450° C. for 30 minutes. Annealing of the powders was performed at 600° C. for 5 to 30 minutes.

Thin films were prepared by adding a surfactant such as the nonionic surfactant, Triton X-100, to the precursor solution with a proper surfactant: solution volume ratio. The metallo-organic micellar solutions were then ultrasonically agitated for 5 minutes and used for casting thin films on silicon wafers, fused silica sold under the tradename (Suprasil), and Pt-coated quartz plates. To prepare multiple layers of PT, PZT and PLZT by thermal-annealing, the films were spin-coated at 2000 rpm, dried 30 minutes at 110° C. and consolidated at 450° C. for 30 minutes before adding additional layers. After the desired thickness was attained, the films were annealed at 600° C. for 30 minutes.

For laser "direct-writing" of ferroelectric film patterns, a Lambda Physik LPX 105 excimer laser (KrF, 248 nm) was employed, operating at a fluence of $1 \times 10^{-5} - 2 \times 10^{-4}$ J/cm$^2$ per pulse. Images were patterned through a copper mask or a 0.05 mm slit onto a spin-coated metallo-organic thin film on silicon or on Pt coated quartz substrates. After 5–50 pulses of laser irradiation, the samples were rinsed with 1M HCl to remove the metallo-organic precursors from the unexposed area, and well-defined patterns of ferroelectric films results.

PT/PZT/PLZT Powders and Films Based on Titanium Acetate Process

Figure 1A:
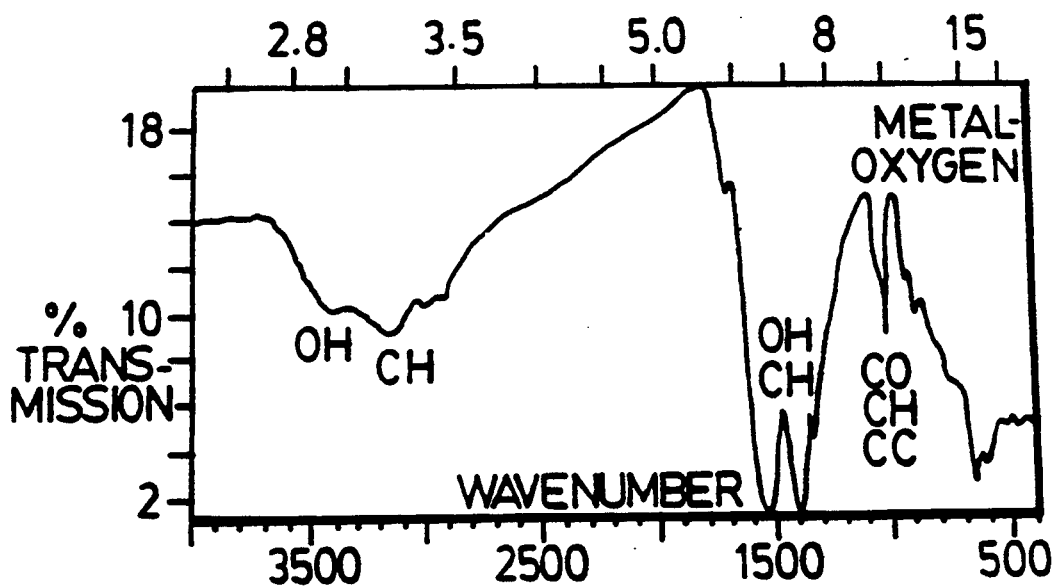
FIG. 1: FTIR spectra using KBr pellet: (a) PT precursors dried at 110° C., (b) consolidated at 450° C., (c) annealed at 600° C., and (d) PT perovskite prepared by sol-gel technique.
Figure 1B:
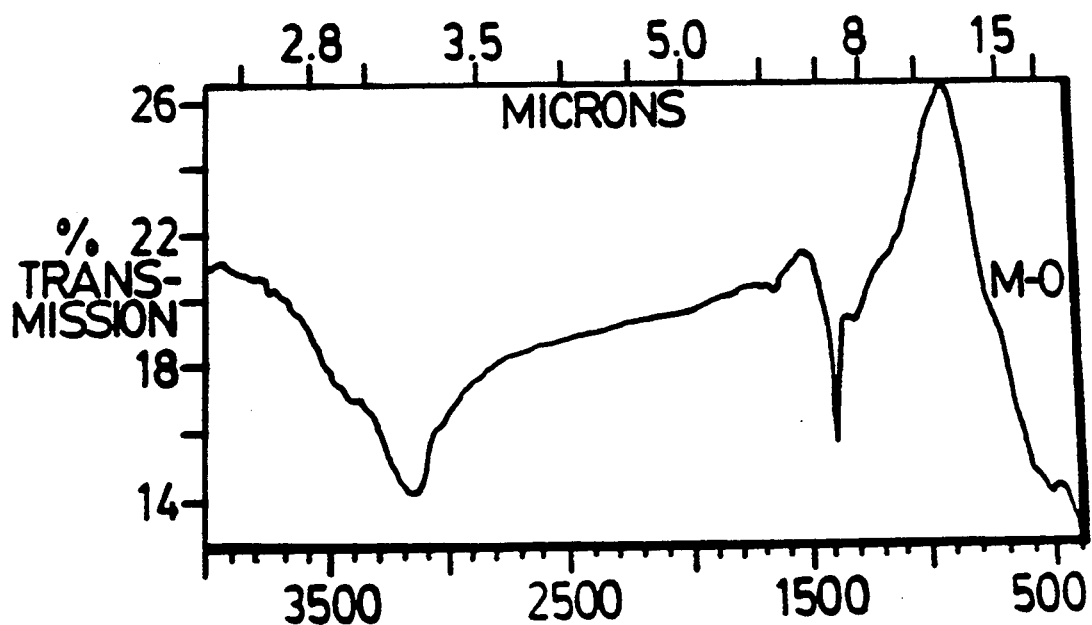
Figure 1C:
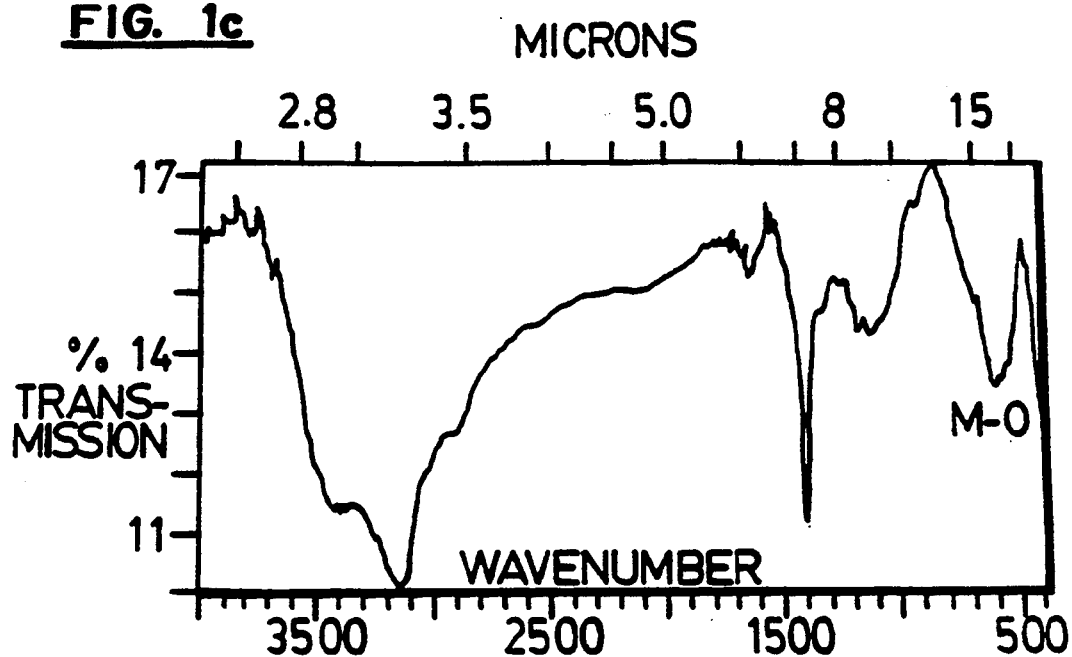
Figure 1D:
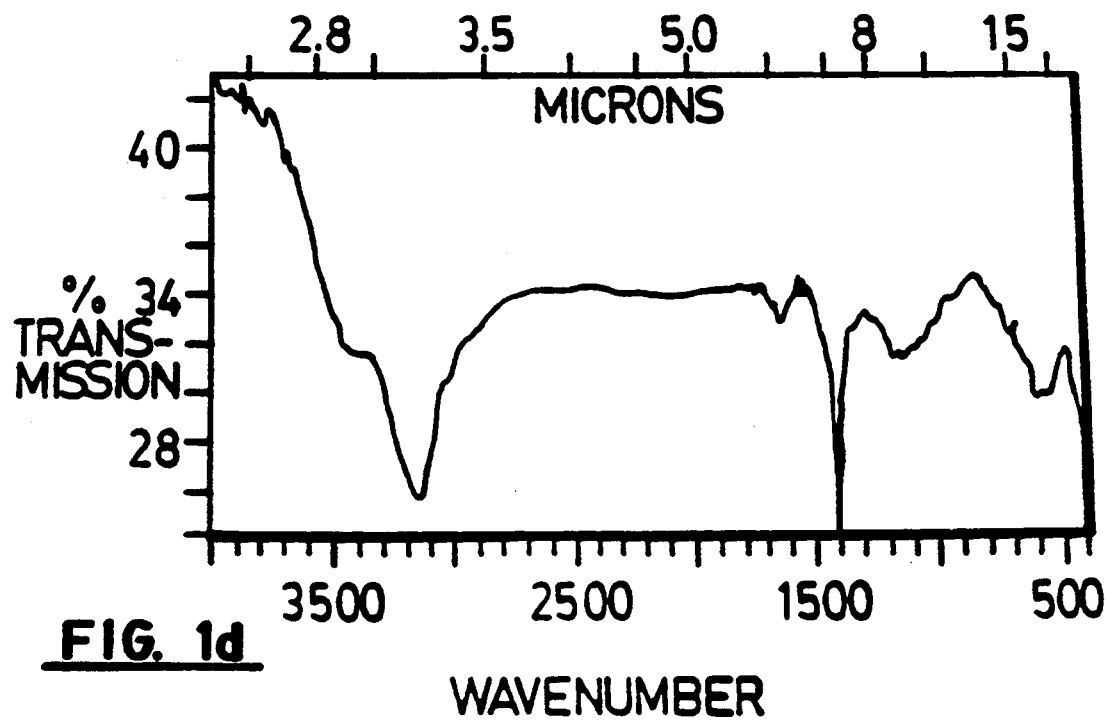

The loss of acetate and formation of metal-oxygen bonds were followed using FTIR spectroscopy. The absorption band centered at about 540 cm$^{-1}$, which is assigned to a TiO$_6$ octahedra vibrational mode, was used to probe the crystallinity of the PT, PZT and PLZT powders. FIG. 1(a) displays the FTIR spectrum of the sample of PT precursor solution dried at 110° C. and prepared in a KBr pellet. The vibrations corresponding to acetate organics and metal-oxygen are clearly observed. When the powder is consolidated at 450° C., FIG. 1(b) shows no spectral peaks attributable to organic moieties (Note: peaks at 1400, 1650, 3150 and 3400 cm$^{-1}$ are impurity bands of the KBr pellet). The small peak at 540 cm$^{-1}$ is indicative of the formation of some crystalline PT at 450° C. After annealing the consolidated powders at 600° C. for 30 minutes, the spectral peak at 540 cm$^{-1}$ becomes significantly larger as shown in FIG. 1(c). The FTIR spectrum of the annealed PT based on the acetate process is very similar to that of PT produced by the sol-gel process as shown in FIG. 1(d).

The change in powder and film structures from consolidation to annealing is shown by the X-ray diffraction spectra in FIG. 2. Spectrum c indicates the formation of some crystalline PT film on the Pt-coated quartz substrate at 450° C. which is consistent with that observed for PT powder in FIG. 1(b). After annealing the consolidated films at 600° C. for 30 minutes, the perovskite structure of the PT film was obtained as seen in spectrum (b). The highly crystalline PT and PZT powders after consolidation at 450° C. and annealing at 600° C. for 30 minutes are clearly displayed in spectra (a) and (d), respectively. A relatively weak x-ray diffraction peak in both spectra (a) and (d) observed at a lattice spacing of about 3.04 Å (28.6°) is due to the contamination by lead oxide, signifying that less than the anticipated 5% loss of lead occurred during the annealing process. 5% excess of lead acetate trihydrate was used in the precursor solution as a flux to crystallize the film and avoid formation of TiO$_2$ and ZrO$_2$ phases. It is noted that the spectral width in FIG. 2(d) for PZT is broader than that in FIG. 2(a) for PT, indicating a smaller grain size for PZT. This is probably due to the higher crystallization temperature of PZT and the acetylacetonate moiety present in the PZT precursor solution, which is pyrolyzed more slowly than the acetate moiety, inhibiting crystal growth.

Effects of Surfactants on the Thin Film Quality of Metallo-organics

It has been found that the addition of an effective wetting amount of a surfactant to the coating solution provides for a uniform and adherent film. While a wide variety of cationic, anionic, amphoteric, and nonionic surfactants are suitable, it has been found that the nonionic surfactants are preferred and polyoxyalkylene non-ionic surfactants are particularly preferred, and most preferred are polyethyleneglycol p-isooctylphenyl ether sold under the tradename Triton-X, in particular, Triton X-100. Those skilled in the surfactant arts will recognize a wide variety of surfactants.

Figure 3D:
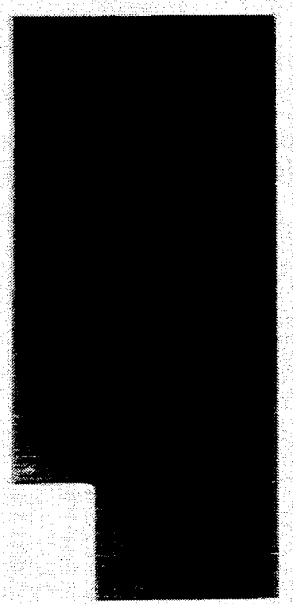
FIG. 3: Optical micrographs of PT metallo-organic film cast on silicon wafer with a solution: Triton X-100 volume ratio (A) no surfactant, (B) 600:1, (C) 300:1 and (D) 100:1. Laser writing patterns: (E) PT precursor dried films on silicon, and (F) PT consolidated films on platinum.
Figure 3E:
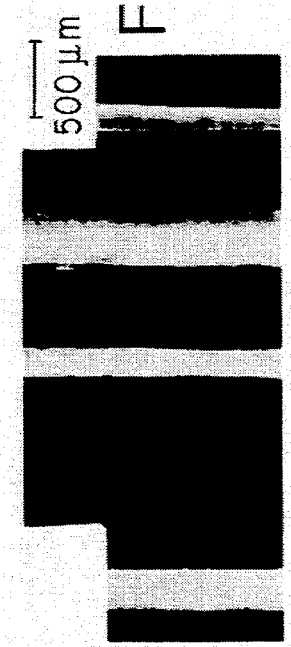
Figure 3F:
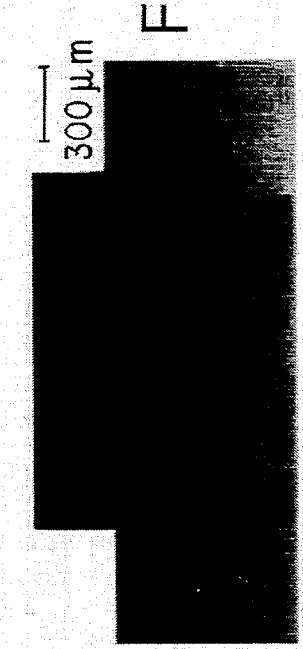
Figure 3A:
Figure 3B:
Figure 3C:

The PT metallo-organic film cast on a silicon wafer with no surfactant, as shown in the optical micrograph in FIG. 3(A), "beads up" and streaks considerably. FIG. 3(B), (C) and (D) show films cast with the solution: surfactant volume ratios of 600:1, 300:1 an 100:1, respectively. The film of optical micrograph (D) is uniform and shows no signs of cracking or streaking. Spectroscopic data indicated no appreciable amount of Triton X-100 remains in the dried PT metallo-organic film, resulting in a favorably large metals/organics ratio in the dried film. It is noted that less surfactant, Triton X-100 is required to coat PT metallo-organics on fused quartz substrates. The amount of type of surfactant can be easily varied to suit a wide variety of substrates.

Laser-writing of PT/PZT Patterns on Si Wafer and Pt Coated Quartz

Representative solid surfaces suitable for coating with PT, PZT, or PLZT in accordance with the present invention are glass, quartz, sapphire, silicon, ceramics materials and nobel metals such as gold and platinum. For device application, the most commonly used substrate is a 3 inch diameter <100> silicon surface where 1000 Å films of titanium and platinum were evaporated at room temperature to serve as a bottom electrode for the PT/PZT/PLZT thin film depositions.

Two different ways of laser-writing patterns of PT/PZT are suitable: (i) Laser "direct-write" of PT metallo-organic films on silicon are shown in FIG. 3(E). The pattern consists of lines 150 μm wide with clear edges. While 1M HCl was required to remove excess precursor from the films dried at 110° C., 0.05M HCl was sufficient for "wet" films. (ii) Laser patterning of a consolidated PZT film on a Pt coated quartz is displayed in FIG. 3(F). It is noted that the type of substrate had an effect on the quality of the laser-written film; films on PT had a glassy appearance whereas those cast on Si were powdery in appearance.

EXAMPLE 1

PT Formulation

Titanium acetate is made by adding 20 ml titanium isopropoxide to 40 ml acetic acid. Stir, then wait until the solution approaches room temperature. 40 ml water is added to the solution and shaken immediately. Then placed on stir plate until all white precipitate disappears. The bulk solution is filtered.

Zirconium acetate is made by adding 30 ml zirconium propoxide to 30 ml acetic acid. The solution is stirred and then is cooled to room temperature. 30 ml of water is added to the bulk solution and the solution is shaken.

A PT bulk precursor solution is made as follows: After titers are taken for lead acetate and titanium acetate, the PT can be formulated to make 100 ml of a 0.2M PT solution combine the lead and titanium in a 1:1 metals ratio.

For example: If the formula weight of the lead precursor is 389 (g precursor/mol metal), and the formula weight of the titanium precursor is 1400 (g precursor/mol metal), then the following calculations must be made to prepare the bulk PT solution:

(molarity of solution)×(volume of solution)×(fraction of metal in solution)×(formula weight of precursor).

Lead: (0.2M)×(0.1 liter)×(1)×(389 g precursor/metal)=7.78 g lead precursor.

Titanium: (0.2M)×(0.1 liter)×(1)×(1400 g precursor/mol metal)=28.0 g titanium precursor.

These 2 precursors are added to a flask and diluted to 100 ml to give a 0.2M solution.

EXAMPLE 2

PZT Formulation

PZT is formulated in the same way as PT shown in example 1. For example, if the formula weight of the zirconium precursor is 1200 (g precursor/mol metal), and the lead and titanium precursors have the same formula weights as the PT above, then the formulation calculation for 100 ml of 0.2M Pb $(Zr_{0.53}Ti_{0.47})O_3$ would be:

Lead: (0.2M)×(.liter)×(1)×(389 g precursor/mol metal)=7.78 g lead precursor.

Zirconium: (0.2M)×(.liter)×(0.53)×(1200 g precursor/mol metal)=12.72 g zirconium precursor.

Titanium: (0.2M)×(0.1 liter)×(0.47)×(1400 g precursor/mol metal)=13.16 g titanium precursor.

These precursors are added to a flask and diluted to 100 ml to give a 0.2M PZT solution.

To make a PZT solution of Pb $(Zr_{0.5}Ti_{0.5})O_3$ with a (50, 50) zirconium to titanium ratio, substitute 0.5 into each "fraction of metal" portion of the equation. To account for desired excess lead concentration substitute the excess percentage lead into the "fraction of metal" portion of the lead expression.

For example, 3% excess lead in 100 ml of 0.2M PZT (50, 50)

Lead: (0.2M)×(0.1 liter)×(1.03)×(389 g precursor/mol metal)=8.01 g lead precursor.

Zirconium: (0.2M)×(0.1 liter)×(0.5)×(1200 g precursor/mol metal)=12.0 g zirconium precursor.

Titanium: (0.2M)×(0.1 liter)×(0.5)×(1400 g precursor/mol metal)=14.0 g titanium precursor.

These precursors are added to a flask and diluted to 100 ml to make a 0.2M PZT(50,50) solution.

EXAMPLE 3

PLZT Formulation

The same formulation procedure can be used to prepare precursor solutions of $(Pb_{1-x}La_x)(Zr_y,Ti_{1-y})_{1-x/4}O_3$ and also the extrinsic ion-doped PT/PZT/PLZT perovskites.

These examples are intended to illustrate the present invention and not to limit it in spirit or scope.

What is claimed is:

1. A method for forming a design of a thin ferroelectric film on a solid surface comprising:
   (a) providing a solution of about 15 to 25 percent by weight of lead titanate, lead zirconate titanate or lead lanthanum zirconate titanate in about 5–10% aqueous acetic acid solution having an effective wetting amount of a surfactant, wherein the titanium component of the solution is in the form of titanium acetate;
   (b) spin-coating the solid surface with the solution of (a);
   (c) drying the coating;
   (d) annealing a portion of the lead titanate, lead zirconate titanate or lead lanthanum zirconate titanate to the solid surface by irradiating the dried spin-coated solid surface with a laser in the desired pattern; and
   (e) washing the solid surface with a strong acid to remove lead titanate, lead zirconate titanate or lead lanthanum zirconate titanate not annealed by irradiation with the laser thereby leaving a pattern of the laser annealed lead titanate, lead zirconate titanate or lead lanthanum zirconate titanate on the solid surface.

2. A method according to claim 1 wherein the solid surface comprises glass, quartz, platinum, gold, silver, sapphire, silicon, or ceramic material.

3. A method according to claim 1 wherein the surfactant in a nonionic polyoxyalkylene surfactant.

4. A method of claim 1 wherein the solution further contains acetate, acetylacetonate, or carbonate salts of a metal ion.

5. A method according to claim 4 wherein the metal ion is selected from the group comprising chromium, iron, neodrymium, europium, praseodymium, molydbenum, ytterbium, terbium, manganese, tungston and vanadium.

* * * * *